United States Patent
Lisart et al.

(10) Patent No.: US 6,324,653 B1
(45) Date of Patent: Nov. 27, 2001

(54) SECOND OPERATION IN INTERNAL PERIPHERAL CIRCUIT (IPC) PERFORMING IN PARALLEL WITH MICROPROCESSOR-CONTROLLED OPERATION AND DETERMINING INTERNAL CLOCK PULSE ELIMINATION WINDOW TO MATCH IPC OPERATING TIME

(75) Inventors: Mathieu Pierre Gabriel Lisart, Aix en Provence; Sylvie Wuidart, Pourrieres, both of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/229,940

(22) Filed: Jan. 13, 1999

(30) Foreign Application Priority Data

Jan. 13, 1998 (FR) .................................................. 98 00468

(51) Int. Cl.[7] ................................ G06F 1/04; G06F 1/06; G06F 1/08; G06F 1/12; H04L 5/00
(52) U.S. Cl. ........................ 713/600; 713/322; 713/400; 713/401; 713/500; 713/501; 713/601; 710/15; 710/18
(58) Field of Search ..................................... 713/322, 400, 713/401, 500, 501, 600, 601; 710/15, 18, 60; 712/32

(56) References Cited

U.S. PATENT DOCUMENTS

| | | | |
|---|---|---|---|
| 4,928,000 | * 5/1990 | Eglise et al. | 235/380 |
| 5,087,829 | * 2/1992 | Ishibashi et al. | 307/269 |
| 5,247,636 | * 9/1993 | Minnick et al. | 395/425 |
| 5,386,517 | * 1/1995 | Sheth et al. | 395/275 |
| 5,442,775 | 8/1995 | Whitted, III et al. . | |
| 5,530,906 | 6/1996 | Cho et al. . | |
| 5,615,376 | * 3/1997 | Ranganathan | 713/322 |
| 5,623,647 | * 4/1997 | Maitra | 395/556 |
| 5,642,487 | * 6/1997 | Flynn et al. | 395/250 |
| 5,649,177 | * 7/1997 | Grosbach et al. | 713/601 |
| 5,737,613 | * 4/1998 | Mensch, Jr. | 395/750.04 |
| 5,774,703 | * 6/1998 | Weiss et al. | 395/556 |
| 5,778,237 | * 7/1998 | Yamamoto et al. | 395/750.04 |
| 5,781,766 | * 7/1998 | Davis | 713/401 |
| 6,023,776 | * 2/2000 | Ozaki | 714/55 |

FOREIGN PATENT DOCUMENTS 0 459 930 A2    12/1991   (EP) .

OTHER PUBLICATIONS

European Patent Abstract of Japanese Publication No. 58166419, published Oct. 1, 1983.
European Patent Abstract of Japanese Publication No. 63153634, published Jun. 27, 1988.
French Search Report dated Aug. 31, 1998 with annex on French Application No. 98–00468.
S. Nahm and W. Sung, "A Full Digital Self–Timed Clock Generation Scheme", 1995 IEEE Tencon, IEEE Region Ten International Conference on Microelectronics VLSI, Hong Kong, Nov. 6–10, 1995, pp. 319–322.

* cited by examiner

Primary Examiner—Thomas Lee
Assistant Examiner—Tanh Q. Nguyen
(74) Attorney, Agent, or Firm—Lisa K. Jorgenson; Stephen Bongini; Fleit, Kain, Gibbons, Gutman & Bongini P.L.

(57) ABSTRACT

An integrated circuit includes a microprocessor driven by an internal clock signal and at least one internal peripheral circuit activated selectively by the microprocessor to perform an operation, wherein said circuit includes a circuit for matching the period of the internal clock signal to the operating time of the activated internal peripheral circuit. The integrated circuit can be used as part of any microcontroller.

6 Claims, 3 Drawing Sheets

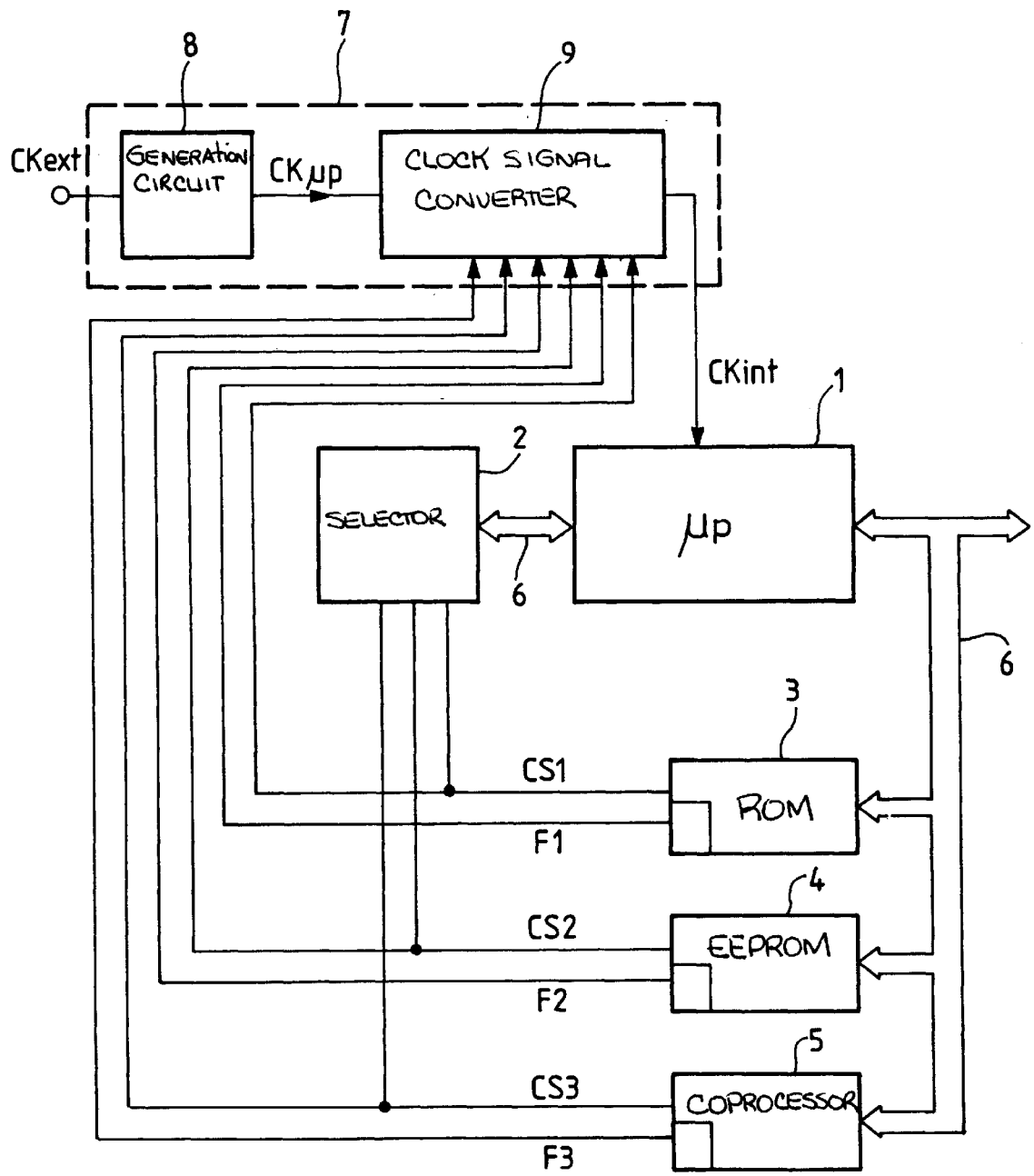
FIG_1

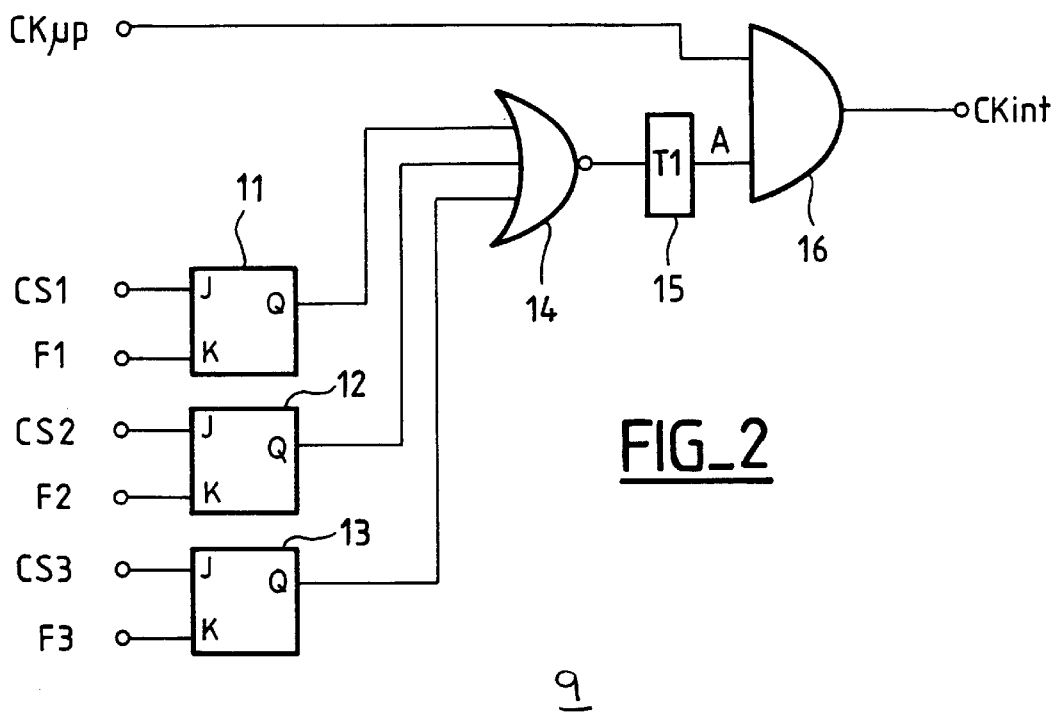
FIG_2
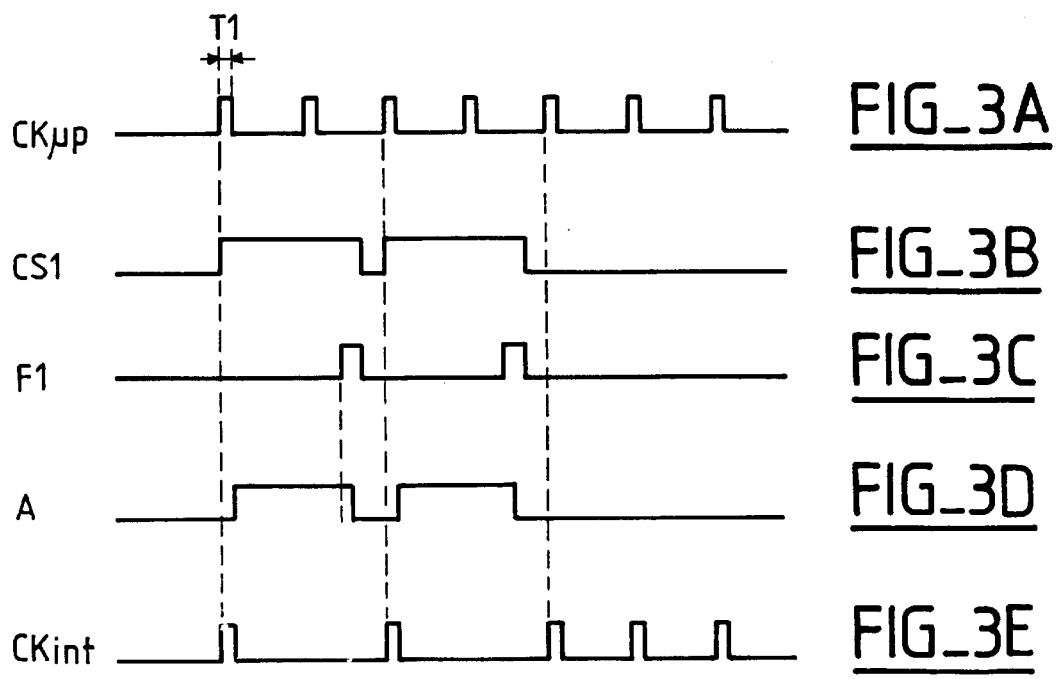
FIG_3A
FIG_3B
FIG_3C
FIG_3D
FIG_3E

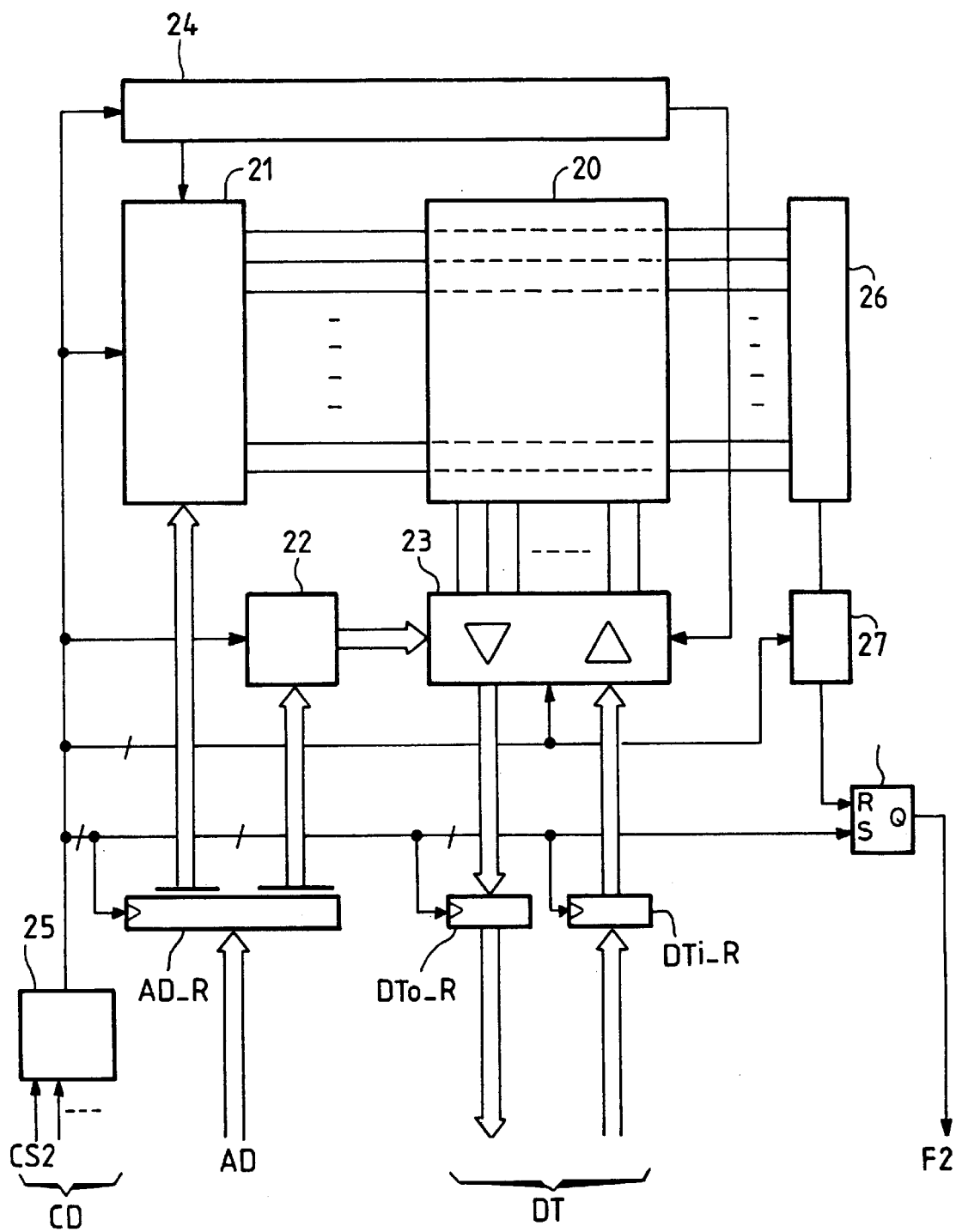
FIG_4

SECOND OPERATION IN INTERNAL PERIPHERAL CIRCUIT (IPC) PERFORMING IN PARALLEL WITH MICROPROCESSOR-CONTROLLED OPERATION AND DETERMINING INTERNAL CLOCK PULSE ELIMINATION WINDOW TO MATCH IPC OPERATING TIME

CROSS-REFERENCE TO RELATED APPLICATIONS

This application is based upon and claims the benefit of priority of the prior French Patent Application 98-00468 filed Jan. 13, 1998, the contents of which are hereby incorporated by reference.

BACKGROUND OF THE INVENTION

1. Field of the Invention

The present invention relates generally to the field of integrated circuits and more specifically to an integrated circuit comprising a microprocessor and at least one internal peripheral circuit whose operating speed has been improved. A circuit of this type is called a microcontroller.

Microcontrollers are systems generally consisting of a microprocessor or central processing unit and a plurality of internal peripheral circuits required for the operation of the system. These internal peripheral circuits are for example a read-only memory that contains the program to be used by the microcontroller, a programmable memory or a coprocessor.

2. Description of the Prior Art

In the prior art, the speed of operation of the microcontrollers is fixed at the time of their manufacture as a function of the internal peripheral circuits that they contain. This speed is dictated by the internal clock signal of the microcontroller. This signal is fixed and its period is chosen so that all the internal peripheral circuits of the microprocessor can work properly. For example, if the microcontroller has a ROM type memory and an EEPROM type memory respectively having access times t1 and t2, the period of the internal clock signal is taken to be greater than or equal to the greatest of the two access times (in practice t2) so that the slowest of these two memories has the necessary time available to carry out the operation controlled by the microprocessor. The duration of an internal clock cycle is therefore permanently greater than or equal to the duration of the read or programming cycle of the slowest memory. More generally, this makes it possible to ensure that, whatever may be the internal peripheral circuit activated by the microprocessor, this circuit will have the time needed to process the instruction coming from the microprocessor.

The speed of operation of the microcontroller is therefore dictated by the slowest internal peripheral circuit of the microcontroller. The overall operation of the microcontroller is thereby then penalized.

In the invention, it is planned to overcome this drawback by matching the operating speed of the microcontroller to the operating time of the internal peripheral circuit activated by the microprocessor.

SUMMARY OF THE INVENTION

Thus, an object of the invention is an integrated circuit comprising a microprocessor driven by an internal clock signal and at least one internal peripheral circuit activated selectively by said microprocessor to perform an operation, wherein said circuit comprises means to match the period of said internal clock signal as a function of the operating time of the activated internal peripheral circuit.

The speed of operation of the integrated circuit is then adapted to the conditions of use of the circuit. Thus, the speed of operation of the integrated circuit is higher when a fast memory is activated than when a slow memory is activated. This matching of the internal clock signal also makes it possible to take precautions against the consequences of possible variations in the manufacturing methods of the elements of the circuit.

To match the period of the internal clock signal, it is planned according to the invention to eliminate the pulses of the internal clock signal during the time taken for the operation performed in the activated internal peripheral circuit. Thus, the means used to match the period of said internal clock signal comprise:

a clock signal generation circuit to generate a primary clock signal that takes the form of a series of pulses dictating a processing speed on the microprocessor, and a circuit for the conversion of the primary clock signal to eliminate the pulses of said primary clock signal during the time of said operation controlled by the microprocessor in said activated internal peripheral circuit in order to match the period of said internal clock signal to the operating time of the activated internal peripheral circuit, said conversion circuit delivering the internal clock signal.

Thus, the time during which the pulses of the primary clock signal are eliminated depends on the activated internal peripheral circuit.

In order that the microprocessor may benefit from a safety margin between two operations, it is also possible, in the internal peripheral circuits, to provide for additional means for the performance, in parallel with the main operation controlled by the microprocessor, of a second operation whose time is slightly greater than that of the main operation. The pulses of the primary clock signal are then eliminated during the time of this second operation.

BRIEF DESCRIPTION OF THE DRAWINGS

Other features and advantages of the invention shall appear from the following detailed description, made with reference to the appended drawings, of which:

FIG. 1 is a general diagram of an exemplary integrated circuit according to the invention;

FIG. 2 shows a possible embodiment of a conversion circuit according to the invention;

FIGS. 3A to 3E show timing diagrams of signals associated with the conversion circuit of FIG. 2; and FIG. 4 shows an exemplary internal peripheral circuit comprising additional means to perform a second operation.

DETAILED DESCRIPTION

Referring to FIG. 1, the integrated circuit of the invention consists of a microprocessor 1 to which there are connected, by means of a connection bus 6, three internal peripheral circuits: a ROM type memory 3, an EEPROM type memory 4 and a coprocessor 5. These three internal peripheral circuits are activated selectively by selection means 2. Signals CS1, CS2 and CS3, used to activate respectively the memory 3, the memory 4 and the coprocessor 5, are delivered by the selection means 2 which are controlled by the microprocessor 1.

An internal clock signal $CK_{int}$ coming from the clock circuit 7 is given to the microprocessor 1. This clock signal is generated from an external clock signal $CK_{ext}$ generally produced by a quartz crystal oscillator. The sequencing of the operations in the microprocessor is then paced by the pulses of the internal clock signal $CK_{int}$.

According to the invention, the rate of the signal $CK_{int}$ is modulated as a function of the operating time of the activated internal peripheral circuit. The operating time in an internal peripheral circuit corresponds to the time needed to perform an operation in this circuit.

To implement this adaptation of the signal $CK_{int}$, the clock circuit 7 takes the following form: it has a clock signal generation circuit 8 to generate a primary clock signal $CK_{up}$ on the basis of an external clock signal $CK_{ext}$ and a circuit 9 for the conversion of the primary clock signal $CK_{up}$, said circuit delivering the internal clock signal $CK_{int}$.

The generation circuit 8 is responsible for producing a primary clock signal $CK_{up}$ setting the processing speed of the operations performed inside the microprocessor 1. When the microprocessor 1 does not activate the internal peripheral circuit, the primary signal is applied as such to the clock input of the microprocessor 1. The processing speed of the microprocessor is then the maximum. By contrast, when the microprocessor starts, for example, a read operation in the memory 3 or 4 or a computation operation in the coprocessor 5, the microprocessor must wait for the end of this operation before starting another one. It is then necessary to slow down the processing speed of the microprocessor. To this end, the clock circuit 7 comprises the conversion circuit 9 responsible for converting the primary clock signal $CK_{up}$. The conversion operation consists in eliminating pulses in the signal $CK_{up}$ to slow down the processing speed of the microprocessor. It eliminates the pulses firm the primary clock signal $CK_{up}$ during the time of the operation launched by the microprocessor, namely so long as the operation controlled by the microprocessor is not completed.

To carry out this elimination, the conversion circuit 9 receives, in addition to the primary clock signal $CK_{up}$ coming from the generation circuit 8, signals relating to the beginning and end of elimination of the pulses. In the example of FIG. 1, the signals relating to the beginning of elimination correspond to the selection signals CS1, CS2 and CS3 designed for the selection respectively of the ROM 3, the EEPROM 4 and the coprocessor 5. These signals do not overlap and their leading edge marks the beginning of the window for the elimination of the pulses. Another signal coming from the activated internal peripheral circuit then marks the end of the elimination window. These end of elimination signals are referenced F1, F2, F3 in FIG. 1.

The signals F1, F2 respectively associated with the memories 3 and 4 are for example signals whose state indicates whether the data elements read are available in the data output register of the corresponding memory. Similarly, the signal F3 associated with the coprocessor may be a signal indicating the fact that the data element computed is in the output register of the coprocessor.

One embodiment of the conversion circuit 9 is illustrated in FIG. 2. It has as many JK type flip-flop circuits as there are internal peripheral circuits in the integrated circuit. Since the circuit 9 of FIG. 2 is designed for the integrated circuit of FIG. 1, it comprises three flip-flop circuits 11, 12 and 13 respectively associated with the ROM 3, the EEPROM 4 and the coprocessor 5. The signals CS1, CS2, CS3 and the signals F1, F2. F3 are applied respectively to the one-setting inputs and the zero-setting inputs of the flip-flop circuits 11, 12, 13. The outputs of the flip-flop circuits 11, 12 and 13 are each connected to an input of a three-input NOR type logic gate 14. The output of the logic gate 14 is connected to an input of a two-input AND type logic gate 16 by means of a delay circuit 15. The delay circuit 15 causes a temporal lag or delay, equal to a duration T1, in the signal coming from the logic gate 14. This delay T1 corresponds to the duration of the high state of the primary clock signal $CK_{up}$. The purpose of the delay T1 is to keep intact the pulse of the signal $CK_{up}$ which activates the selection of the memory. The delay circuit 15 may be unnecessary when the delay T1 is already generated by the flip-flop circuits 13, 14, 15 and the logic gate 14. A designates the signal at the output of the delay circuit 15. The logic gate 16 furthermore receives a primary clock signal $CK_{up}$ at its second input. The logic gate 16 delivers the internal clock signal $CK_{int}$.

The working of the conversion circuit 9 is illustrated by FIGS. 3A to 3E. These figures respectively show the timing diagrams of the signals $CK_{up}$, CS1, F1, A and $CK_{int}$ when the microprocessor 1 activates two consecutive read operations in the ROM 3. To select the memory 3, the signal CS1 is set at 1. The output of the flip-flop circuit 11 then goes to 1 and the signal A goes to 1 with a time lag T1. During the state 1 of the signal A, the pulses of the signal $CK_{up}$ are eliminated and the signal A goes back to 0 only when the signal F1 goes to 1. The result thereof is the signal $CK_{int}$ shown in FIG. 3E.

According to one alternative embodiment, it is possible to provide for the insertion, into each internal peripheral circuit, of additional means to perform a second operation in parallel with the main operation controlled by the microprocessor. It is then this second operation that determines the temporal window for the elimination of the pulses. The time of the second operation is of course slightly greater than that of the main operation to obtain a safety margin between two operations.

FIG. 4 illustrates an EEPROM provided with additional means as defined here above. The memory conventionally comprises a matrix 20 of memory cells connected to a row decoder 21 and a column decoder 22 associated with read and write circuits 23. The writing of the matrix 20 is performed by means of a programming circuit 24. The decoders 21 and 22 are connected to an address register AD-R which receives addresses AD coming from the address bus. The read and write circuits 23 are connected respectively to an output data register DTO-R and a data input register DTi-R. These registers are connected to the data bus of the integrated circuit. The assembly is controlled by a control circuit 25 which receives commands CD coming from the control bus of the integrated circuit. In particular, it receives the selection command CS2.

For the implementation of the alternative embodiment, the memory is complemented by a column 26 of additional memory cells called reference cells and means 27 to read them. The column 26 is connected to the row decoder 21 and to the means 27. Through this structure, with each row of the matrix, there is associated a reference cell 20. The read means 27 are furthermore controlled by the control circuit 2 of the memory.

This memory works as follows: the reading of a memory cell of the matrix 1 (main operation) activates the reading of the reference cell (second operation) connected to the same word line. In this embodiment, the reference cell preferably memorizes a "1" which, during its reading, then activates an RS type flip-flop circuit 28 generating the signal F2. The signal F2 is zero-set by the control circuit 2 of the memory. Since the reference cell is located at the end of the matrix of the memory, the read time of the reference cell is necessarily greater than that of the cell of the matrix. In this exemplary embodiment the pulses of the signal $CK_{\mu p}$ are eliminated during the operation for reading this reference cell.

Similarly, for internal peripheral circuits other than memories, it is possible to provide for means making it possible to activate a path equivalent to the path for the reading of the reference cells of the memories in order to define a temporal window of elimination adapted to these circuits.

According to another aspect of the invention an information handling system includes a microcontroller. A well known example of an information handling system is a personal computer but other examples include cable television interfaces, television units, and other Internet user interfaces. The invention can be used in any microprocessor-controlled system that receives information and performs operations on the information.

What is claimed is:

1. An integrated circuit comprising at least one microprocessor driven by an internal clock signal and at least one internal peripheral circuit, each internal peripheral circuit being activated selectively by at least one microprocessor to perform an operation, wherein said integrated circuit further comprises means for matching the period of said internal clock signal to the operating time of the activated internal peripheral circuit, and the means for matching comprise:

means, in each internal peripheral circuit, for performing a second operation in parallel to said operation controlled by the microprocessor, the time of said second operation being equal to or slightly greater than the time of the operation controlled by the microprocessor, a clock signal generation circuit to generate a primary clock signal that takes the form of a series of pulses dictating a processing speed on the microprocessor, and a circuit for the conversion of the primary clock signal to eliminate the pulses of said primary clock signal during said second operation in order to match the period of said internal clock signal to the operating time of the activated internal peripheral circuit, said conversion circuit delivering the internal clock signal.

2. The integrated circuit of claim 1 wherein said clock signal generation circuit includes means for generating said primary clock signal from an external clock signal.

3. An information handling system comprising a microcontroller comprising:

an integrated circuit comprising of at least one microprocessor driven by an internal clock signal and at least one internal peripheral circuit, each internal peripheral circuit being activated selectively by at least one microprocessor to perform an operation, wherein said integrated circuit further comprises means for matching the period of said internal clock signal to the operating time of the activated internal peripheral circuit, and the means for matching comprise:

means, in each internal peripheral circuit, for performing a second operation in parallel to said operation controlled by the microprocessor, the time of said second operation being equal to or slightly greater than the time of the operation controlled by the microprocessor, a clock signal generation circuit to generate a primary clock signal that takes the form of a series of pulses dictating a processing speed on the microprocessor, and a circuit for the conversion of the primary clock signal to eliminate the pulses of said primary clock signal during said second operation in order to match the period of said internal clock signal to the operating time of the activated internal peripheral circuit said conversion circuit delivering the internal clock signal.

4. The information handling system of claim 3, wherein said clock signal generation circuit includes means for generating said primary clock signal from an external clock signal.

5. A method for operating a microcontroller that includes at least one microprocessor and at least one internal peripheral circuit, said method comprising the steps of:

driving said at least one microprocessor by an internal clock signal;

selectively activating one of the at least one internal peripheral circuit by said at least one microprocessor to perform an operation; and matching the period of said internal clock signal to the operating time of the activated internal peripheral circuit, wherein the matching step includes the sub-steps of:

in the activated internal peripheral circuit, performing a second operation in parallel to said operation controlled by the microprocessor, the time of said second operation being equal to or slightly greater than the time of the operation controlled by the microprocessor;

generating a primary clock signal that takes the form of a series of pulses dictating a processing speed on the microprocessor; and converting the primary clock signal to eliminate the pulses of said primary clock signal during said second operation in order to match the period of said internal clock signal to the operating time of the activated internal peripheral circuit, so as to deliver the internal clock signal.

6. The method of claim 5, wherein in the sub-step of generating a primary clock signal, the primary clock signal is generated from an external clock signal.

* * * * *